(12) United States Patent
Lu

(10) Patent No.: US 11,943,960 B2
(45) Date of Patent: Mar. 26, 2024

(54) LIGHT EXTRACTING SUBSTRATE FOR ORGANIC LIGHT EMITTING DIODE

(71) Applicant: Vitro Flat Glass LLC, Cheswick, PA (US)

(72) Inventor: Songwei Lu, Wexford, PA (US)

(73) Assignee: Vitro Flat Glass LLC, Cheswick, PA (US)

(*) Notice: Subject to any disclaimer, the term of this patent is extended or adjusted under 35 U.S.C. 154(b) by 585 days.

(21) Appl. No.: 16/804,146

(22) Filed: Feb. 28, 2020

(65) Prior Publication Data

US 2020/0203665 A1    Jun. 25, 2020

Related U.S. Application Data

(62) Division of application No. 13/364,898, filed on Feb. 2, 2012, now Pat. No. 10,581,020.

(60) Provisional application No. 61/440,588, filed on Feb. 8, 2011.

(51) Int. Cl.
*H10K 50/854* (2023.01)
*G02B 5/02* (2006.01)

(52) U.S. Cl.
CPC .......... *H10K 50/854* (2023.02); *G02B 5/0221* (2013.01); *G02B 5/0242* (2013.01); *G02B 5/0268* (2013.01); *G02B 5/0278* (2013.01); *Y10T 29/49826* (2015.01); *Y10T 29/49885* (2015.01)

(58) Field of Classification Search
CPC ............ H01L 51/5268; H01L 51/5262; G02B 5/0221; G02B 5/0242; G02B 5/0268; G02B 5/0278; G02B 5/02; G02B 5/021; H10K 50/854; H10K 50/85

See application file for complete search history.

(56) References Cited

U.S. PATENT DOCUMENTS

| | | | |
|---|---|---|---|
| 4,190,321 A | 2/1980 | Dorer et al. | |
| 7,663,300 B2 | 2/2010 | Hack et al. | |
| 7,851,016 B2 | 12/2010 | Arbab et al. | |
| 2004/0058167 A1 | 3/2004 | Arbab et al. | |
| 2005/0007000 A1 | 1/2005 | Chou et al. | |
| 2007/0108900 A1 | 5/2007 | Boek et al. | |
| 2009/0072733 A1 | 3/2009 | Funayama et al. | |

(Continued)

FOREIGN PATENT DOCUMENTS

| | | |
|---|---|---|
| EP | 1906462 A2 | 4/2008 |
| JP | 9213477 | 8/1997 |

(Continued)

OTHER PUBLICATIONS

Saxena et al., "A Review on the Light Extraction Techniques in Organic Electroluminescent Devices", Optical Materials, Nov. 2009, pp. 221-233, vol. 32:1, Elsevier Science Publishers B.V. Amsterdam, NL.

*Primary Examiner* — Derek S. Chapel
*Assistant Examiner* — Adam W Booher
(74) *Attorney, Agent, or Firm* — The Webb Law Firm

(57) ABSTRACT

A light extraction substrate includes a glass substrate having a first surface and a second surface. A first light extraction region can be defined on and/or adjacent the first surface. The first light extraction region includes nanoparticles. A second light extraction region can be defined on at least a part of the second surface. The second light extraction region has a surface roughness of at least 10 nm.

20 Claims, 1 Drawing Sheet

(56) References Cited

U.S. PATENT DOCUMENTS

| | | |
|---|---|---|
| 2009/0153972 A1 | 6/2009 | Nakamura et al. |
| 2010/0019664 A1 | 1/2010 | Mishima |
| 2010/0059772 A1 | 3/2010 | Yamanaka |
| 2010/0059778 A1 | 3/2010 | Shimizu et al. |
| 2010/0124642 A1 | 5/2010 | Lu et al. |
| 2010/0124643 A1 | 5/2010 | Lu et al. |
| 2010/0136724 A1* | 6/2010 | Mary ................ H01L 51/5262 438/22 |
| 2010/0285290 A1 | 11/2010 | Lu et al. |
| 2011/0017287 A1 | 1/2011 | Borrelli et al. |
| 2011/0117287 A1 | 5/2011 | Ueno et al. |
| 2011/0143094 A1* | 6/2011 | Kitada ................ C23C 24/04 427/532 |
| 2011/0233168 A1 | 9/2011 | Krummacher |
| 2011/0278635 A1 | 11/2011 | Nakamura et al. |
| 2011/0290322 A1 | 12/2011 | Meguro et al. |
| 2012/0091488 A1* | 4/2012 | Vermersch .......... H01L 51/5215 428/141 |
| 2012/0112224 A1 | 5/2012 | Le Bellac et al. |
| 2012/0189766 A1 | 7/2012 | Rajala et al. |
| 2012/0262639 A1* | 10/2012 | Kim ................ G02B 30/25 349/96 |

FOREIGN PATENT DOCUMENTS

| | | |
|---|---|---|
| JP | 200538681 A | 2/2005 |
| JP | 2006502074 | 1/2006 |
| JP | 2008243669 A | 10/2008 |
| JP | 201067464 A | 3/2010 |
| KR | 1020080112312 A | 12/2008 |
| KR | 1020100125443 A | 11/2010 |
| WO | 0128941 A1 | 4/2001 |
| WO | 2004035496 A2 | 4/2004 |
| WO | 2006095632 A1 | 9/2006 |
| WO | 2007059223 A1 | 5/2007 |
| WO | 2007072856 A1 | 6/2007 |
| WO | 2009120330 A2 | 10/2009 |
| WO | 2010084924 A1 | 7/2010 |
| WO | 2010090142 A1 | 8/2010 |
| WO | 2010112788 A2 | 10/2010 |

\* cited by examiner

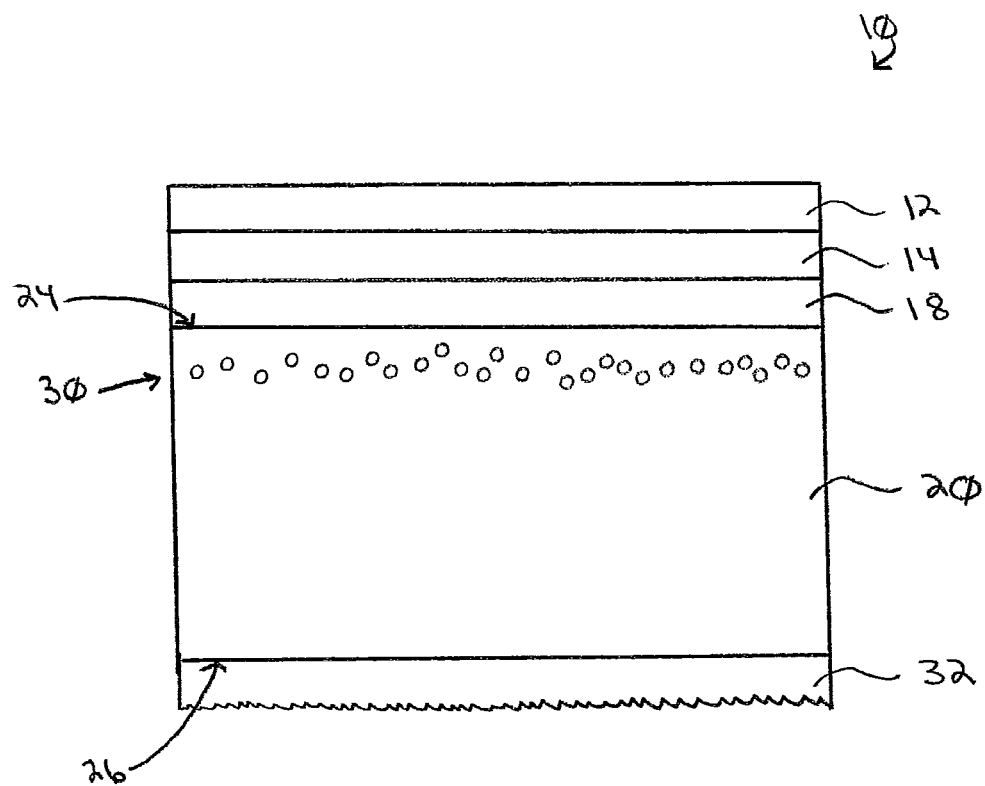

LIGHT EXTRACTING SUBSTRATE FOR ORGANIC LIGHT EMITTING DIODE

CROSS REFERENCE TO RELATED APPLICATION

This application is a divisional of U.S. application Ser. No. 13/364,898 filed Feb. 2, 2012, which claims priority to U.S. Provisional Application No. 61/440,588, filed Feb. 8, 2011, the entire disclosures of which are hereby incorporated by reference herein.

BACKGROUND OF THE INVENTION

Field of the Invention

This invention relates generally to organic light emitting diodes, solar or photovoltaic (PV) cells, daylighting windows, and, more particularly, to a substrate having increased light scattering for improved light utilization.

Technical Considerations

An organic light emitting diode (OLED) is a light-emitting device having an emissive electroluminescent layer incorporating organic compounds. The organic compounds emit light in response to an electric current. Typically, an emissive layer of organic semiconductor material is situated between two electrodes (an anode and a cathode). When electric current is passed between the anode and the cathode, the organic material emits light. OLEDs are used in numerous applications, such as television screens, computer monitors, mobile phones, PDAs, watches, lighting, and various other electronic devices.

OLEDs provide numerous advantages over conventional inorganic devices, such as liquid crystal displays. For example, an OLED functions without the need for a back light. In low ambient light, such as a dark room, an OLED screen can achieve a higher contrast ratio than conventional liquid crystal displays. OLEDs are also thinner, lighter, and more flexible than liquid crystal displays and other lighting devices. OLEDs also require less energy to operate.

However, one disadvantage with OLED devices is that they typically emit less light per unit area than inorganic solid-state based point-light sources. In a typical OLED lighting device, about 80% of the light emitted from the organic material is trapped inside the device due to the optical waveguide effect in which the light emitted from the organic emitting layer is reflected back from the interface of the organic emitting layer/conductive layer (anode), the interface of the conductive layer (anode)/substrate, and the outer surface of the substrate. Only about 20% of the light emitted from the organic material escapes the optical waveguide effect and is emitted by the device. Therefore, it would be advantageous to provide a device and/or method to extract more light from an OLED device than is possible with conventional methods.

Photovoltaic solar cells are in principle counterparts to light emitting diodes. Here, the semiconductor device absorbs the energy of light (photons) and converts that energy into electricity. Similar to OLEDs, the efficiency of the photovoltaic device is relatively low. At the module level, for example, only up to 20% of the incident light is typically converted to electric energy. In one class of photovoltaic devices, those consisting of thin film PV cells, this efficiency can be as low as 6-7%, depending on the semi-conducting material and the junction design. One way to increase the efficiency of the photovoltaic device is to increase the fraction of the solar light that is absorbed near the photovoltaic semiconductor junction. Thus, the present invention also finds use in the field of solar cells.

SUMMARY OF THE INVENTION

A light extraction substrate comprises a glass substrate having a first surface and a second surface. The light extraction substrate comprises a first light extraction region and/or a second light extraction region. The first light extraction region, if present, is defined on and/or adjacent the first surface. The first light extraction region can comprise nanoparticles incorporated into the substrate at a distance from the first surface. The second light extraction region, if present, can be defined on at least a portion of the second surface. The second light extraction region can have a surface roughness of at least 10 nm.

A light extraction substrate comprises a glass substrate having a first surface and a second surface. A first light extraction region is defined on and/or adjacent the first surface. The first light extraction region comprises nanoparticles incorporated into the substrate at a distance from the first surface. A second light extraction region is defined on at least a portion of the second surface. The second light extraction region has a surface roughness of at least 10 nm.

A method for making a light extraction substrate, such as a glass substrate having a first surface and a second surface, comprises forming a first light extraction region on and/or adjacent the first surface. The first light extraction region is formed by heating the substrate to a temperature sufficient to soften the first surface and then directing or propelling nanoparticles toward the first surface such that at least a portion of the nanoparticles penetrate the first surface. A second light extraction region is formed on at least a portion of the second surface. The second light extraction region can be, for example, a coating or a textured pattern. The second light extraction region has a surface roughness of at least 10 nm.

BRIEF DESCRIPTION OF THE DRAWING

FIG. 1 is a side, sectional view (not to scale) of an OLED device incorporating a substrate of the invention.

DESCRIPTION OF THE PREFERRED EMBODIMENTS

As used herein, spatial or directional terms, such as "left", "right", "inner", "outer", "above", "below", and the like, relate to the invention as it is shown in the drawing FIGURE. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Additionally, all documents, such as but not limited to, issued patents and patent applications, referred to herein are to be considered to be "incorporated by reference" in their entirety. Any reference to amounts, unless otherwise specified, is "by weight percent".

For purposes of the following discussion, the invention will be discussed with reference to a conventional OLED device. However, it is to be understood that the invention is not restricted to use with OLED devices but could be practiced in other fields, such as, but not limited to, photovoltaic thin film solar cells. For other uses, such as thin film solar cells, the glass architecture described later in this application might have to be modified.

An OLED device 10 incorporating features of the invention is shown in FIG. 1. The OLED device 10 includes a cathode 12, an emissive layer 14, and an anode 18. However, unlike conventional OLED devices, the OLED device 10 includes a substrate 20 incorporating features of the invention.

The structure and operation of a conventional OLED device will be well understood by one of ordinary skill in the art and, therefore, will not be described in detail. An exemplary OLED device is described in U.S. Pat. No. 7,663,300. The cathode 12 can be any conventional OLED cathode. Examples of suitable cathodes include metals, such as but not limited to, barium and calcium. The cathode typically has a low work function. The emissive layer 14 can be a conventional organic electroluminescent layer as known in the art. Examples of such materials include, but are not limited to, small molecules such as organometallic chelates (e.g., $Alq_3$), fluorescent and phosphorescent dyes, and conjugated dendrimers. Examples of suitable materials include triphenylamine, perylene, rubrene, and quinacridone. Alternatively, electroluminescent polymeric materials are also known. Examples of such conductive polymers include poly(p-phenylene vinylene) and polyfluorene. Phosphorescent materials could also be used. Examples of such materials include polymers such as poly(n-vinylcarbazole) in which an organometallic complex, such as an iridium complex, is added as a dopant. The anode 18 can be a conductive, transparent material, such as a metal oxide material, such as, but not limited to, indium tin oxide (ITO) or aluminum-doped zinc oxide (AZO). The anode typically has a high work function.

Unlike conventional OLED devices, the OLED device 10 is carried on a substrate 20 incorporating features of the invention. The substrate 20 is a transparent substrate having a first surface 24 and a second surface 26. Examples of suitable materials for the substrate 20 include, but are not limited to, glass, such as conventional soda-lime silicate glass, for example, float glass. The substrate 20 has a high visible light transmission at a reference wavelength of 550 nanometers (nm) and a reference thickness of 3.2 mm. By "high visible light transmission" it is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%, such as greater than or equal to 95%, at a 3.2 mm reference thickness. Non-limiting examples of glass that can be used for the practice of the invention include, but are not limited to, Starphire®, Solarphire®, Solarphire® PV, and CLEAR™ glass, all commercially available from PPG Industries, Inc. of Pittsburgh, Pennsylvania. The substrate 20 can have any desired thickness, such as in the range of 0.5 mm to 10 mm, such as 1 mm to 10 mm, such as 1 mm to 4 mm, such as 2 mm to 3.2 mm.

The substrate 20 incorporates at least one of: (1) a first (e.g., an internal) light extraction layer or region 30; and/or (2) a second (e.g., an external) light extraction layer or region 32. Adding light extraction regions in the substrate reduces the waveguide effect described above so that less light is reflected back from the various interfaces, and less light is trapped inside the device. This allows more light to be emitted from the device. The first extraction region 30 is formed by nanoparticles 34 incorporated on the first surface 24 of the substrate 20 or embedded in or incorporated into a region of the glass adjacent the first surface 24. Examples of suitable nanoparticles 34 include, but are not limited to, oxide nanoparticles, such as but not limited to alumina, titania, cerium oxide, zinc oxide, tin oxide, silica, and zirconia. These oxide nanoparticles can be incorporated into the substrate 20 at a depth in the range of 0 microns to 50 microns, such as 0 microns to 10 microns, such as 0 micron to 5 microns, such as 0 microns to 3 microns. The first surface 24 incorporating the first extraction region 30 can be smoother than the second surface 26. For example, the first surface 24 can have an average surface roughness ($R_a$) up to 100 nm, such as up to 50 nm, such as up to 20 nm, such as up to 10 nm, such as up to 5 nm, such as in the range of 1 nm to 100 nm, such as in the range of 1 nm to 50 nm, such as 1 nm to 20 nm, such as 1 nm to 10 nm, such as 1 nm to 5 nm.

The external extraction region 32 can be formed by a coating, such as a metal oxide coating having a roughened exterior surface. Examples of oxides useful for the external extraction layer 32 include, but are not limited to, silica, alumina, zinc oxide, titania, zirconia, tin oxide, and mixtures thereof. The external extraction layer 32 can have an average surface roughness ($R_a$) in the range of 5 nm to 500 nm, such as 5 nm to 500 nm, such as 50 nm to 500 nm, such as 50 nm to 200 nm, such as 100 nm to 200 nm and/or a root mean square roughness ($R_q$) in the range of 100 nm to 250 nm, such as 150 nm to 200 nm. The coating can have a thickness in the range of 10 nm to 500 nm, such as 50 nm to 500 nm, such as 100 nm to 500 nm. The external extraction layer 32 can be a single layer or optionally a multilayer coating.

Alternatively, the external extraction region 32 can be formed by texturing the second surface 26 of the glass rather than applying a separate coating layer. For example, the second surface 26 can be scored or cut to form a textured surface.

The first extraction region 30 and second extraction region 32 can provide the substrate 20 with haze in the range of 1% to 100%, such as 1% to 90%, such as 1% to 80%, such as 1% to 60%, such as 1% to 50%, such as 10% to 80%, such as 10% to 40%, as measured by a conventional Haze-Gard Plus hazemeter, commercially available from BYK-Gardner.

Operation of the OLED device 10 will now be described with particular reference to FIG. 1.

During operation, a voltage is applied across the anode 18 and the cathode 12. A current of electrons flows from the cathode 12 to the anode 18 through the emissive layer 14. This electric current causes the emissive layer 14 to emit light. The substrate 20 of the invention provides for increased light extraction as compared to an OLED device without the substrate 20. Electromagnetic radiation in the form of light waves emitted by the emissive layer 14 travels through the anode 18 into the substrate 20. These light waves encounter the internal extraction layer 30 and become more scattered, causing the light waves to travel more randomly through the substrate 20. When the light waves exit the substrate 20 at the second surface 26, the roughened surface of the external extraction layer 32 causes further scattering of the light waves. The combination of the internal extraction layer 30 scattering and external extraction layer 32 scattering increases the overall light extraction for the OLED device 10 by decreasing the wave guide effect. While the above embodiment contemplates the presence of both the internal extraction layer 30 and the external extraction layer 32, in other embodiments only one or the other of these layers need be present.

An exemplary method of forming a substrate of the invention will now be described.

In a float glass process, glass batch materials are melted in a furnace to form a glass melt. The glass melt is poured into a float chamber having a bath of molten metal, such as a molten tin bath. The molten glass spreads across the surface of the molten metal to form a glass ribbon. In one practice of the invention, a flame spray device or combustion deposition device is mounted in the float chamber above the glass ribbon. A suitable flame spray device is commercially available from Beneq-Oy Vantaa, Finland. Another flame spray device is described in WO 01/28941. In the flame spray device, coating materials are atomized, combusted, and then sprayed directly onto the hot float glass ribbon. The particles 34 are formed on and/or diffused into the surface of the ribbon or penetrate the surface and are incorporated into the upper portion of the float glass ribbon. These particles 34, such as metal oxide nanoparticles, are present on the surface of the glass or are diffused into the glass and react with the glass matrix. This process can be practiced at any suitable place in the float chamber but is believed to be more practical at locations where the temperature of the float glass ribbon is in the range of 400° C. to 1,000° C., such as 500° C. to 900° C., such as 500° C. to 800° C., such as 600° C. to 800° C., such as 700° C. to 800° C. As the float ribbon exits the float chamber, the glass has nanoparticles 34 embedded in the surface of the glass sheet or incorporated into a region of the glass adjacent the upper surface of the glass. These nanoparticles 34 define the first extraction region 30. During the incorporation process of nanoparticles 34 in the glass surface at an elevated temperature, the glass surface smoothes out by softening at high temperature. The glass can be heat treated or annealed in a conventional manner.

In a non-float process, the substrate can be heated, such as in a furnace, by a flame, or by another heat source, until the glass surface has softened. The nanoparticles can then be directed or propelled at the softened surface, such as by a carrier gas. As will be appreciated, the temperature of the substrate is one factor in determining how far the nanoparticles penetrate into the substrate. As will be appreciated, the lower the viscosity of the substrate, the farther the nanoparticles should penetrate. A suitable deposition process is described in U.S. Pat. No. 7,851,016.

After the internal extraction layer 30 has been formed (e.g., after the glass has left the float chamber in a float glass process), the external extraction layer 32 can be provided. For example, the external extraction layer 32 can be formed by applying a coating, such as a metal oxide coating, onto the surface of the glass opposite the surface having the nanoparticles 34 incorporated therein. This can be accomplished in any conventional manner, such as by conventional sol-gel or spray pyrolysis methods, inside an annealing lehr, or at the exit of the annealing lehr, where the temperature is in the range of 50° C. to 600° C., such as 100° C. to 400° C., such as 150° C. to 350° C., such as 200° C. to 300° C. The resultant substrate thus incorporates both the first (i.e., internal) extraction layer 30 and the second (i.e., external) extraction layer 32. However, in the broad practice of the invention, only one of these extraction regions need be present.

As an additional step (either on-line or off-line), a conductive metal oxide layer to form the anode 18 can be applied in any conventional manner over the first surface 24 of the glass substrate 20. For example, a layer of indium tin oxide or aluminum doped zinc oxide can be applied by magnetron sputter vapor deposition, chemical vapor deposition, or any other suitable method to form the anode. The anode 18 can be deposited before or after the deposition of the first extraction region 30 by an on-line process, or after the deposition of both the first extraction region 30 and the second extraction layer 32. In addition, an optional underlayer coating stack (such as described in U.S. Publication Nos. 2010/0285290, 2010/0124642, or 2010/0124643) can be incorporated under the anode 18 (i.e., between the anode 18 and the substrate 20) to increase the transmittance of the substrate 20 with the underlayer coating stack and the anode 18 and at least one of the internal extraction region 30 or the external extraction region 32. The substrate 20 with the conductive anode 18 and at least one of the internal extraction region 30 or the external extraction region 32 can then be supplied to an OLED manufacturer who can subsequently apply the emissive layer 14 and the cathode 12 to form an OLED incorporating the light extraction substrate 20.

Examples of the invention will now be described. However, it is to be understood that the invention is not limited to these specific examples.

EXAMPLES

In the following Examples, the substrate (unless indicated to the contrary) is Solarphire® glass commercially available from PPG Industries Ohio, Inc. having a thickness of 2 millimeters (mm). The haze and transmittance values are percentage values and were measured using a Haze-Gard Plus hazemeter commercially available from BYK-Gardner USA. The temperature values are in degrees Fahrenheit (° F.) and the pressure values are in pounds per square inch (psi).

Example 1

This Example illustrates a substrate with an external extraction layer on one side. TEOS means tetraethyl orthosilicate; TPT means titanium isopropoxide; DI water means deionized water; and IPA means isopropyl alcohol.

A first solution (as set forth in Table 1) and a second solution (as set forth in Table 2) were prepared. The TPT was added to adjust the refractive index of the coating.

TABLE 1

(SOLUTION 1)

| MATERIAL | AMT. (g) | PERCENT(%) |
|---|---|---|
| TPT | 50 | 24 |
| IPA | 50 | 24 |
| $HNO_3$ | 10 | 5 |
| DI Water | 100 | 48 |
| Total | 210 | 100 |

TABLE 2

(SOLUTION 2)

| MATERIAL | AMT. (g) | PERCENT(%) |
|---|---|---|
| TEOS | 80 | 21 |
| Ethanol | 280 | 72 |
| DI Water | 28 | 7 |
| Total | 388 | 100 |

These solutions were mixed in the proportions shown in Table 3 and Table 4 to form coating composition 1 (Table 3) and coating composition 2 (Table 4).

TABLE 3

(COATING 1)

| MATERIAL | AMT. (g) | PERCENT(%) |
|---|---|---|
| Solution 1 | 10 | 5 |
| Solution 2 | 190 | 95 |
| Total | 200 | 100 |

TABLE 4

(COATING 2)

| MATERIAL | AMT. (g) | PERCENT(%) |
|---|---|---|
| Solution 1 | 20 | 10 |
| Solution 2 | 180 | 90 |
| Total | 200 | 100 |

The coating compositions were spray applied onto a surface of oven heated glass substrates using a conventional spray coating device to form an external extraction layer. As set forth in Table 5, the resultant coatings provided the substrate with haze greater than 10 while still maintaining transmittance greater than 90 percent.

TABLE 5

| SAMPLE # | COATING COMPOSITION | SPRAY TIME (min.) | OVEN TEMP ° F. | AIR PRESSURE (psi) | HAZE (Post-Spray) | TRANSMITTANCE (Post-Spray) |
|---|---|---|---|---|---|---|
| 1 | 1 | 5 | 450 | 50 | 11.8 | 94.4 |
| 2 | 1 | 10 | 450 | 50 | 21.1 | 94.2 |
| 3 | 2 | 5 | 450 | 50 | 10.3 | 94.1 |
| 4 | 2 | 10 | 450 | 50 | 23.1 | 94.0 |

Example 2

This Example illustrates a coated substrate with an external extraction layer on one surface and an indium tin oxide coating on an opposite surface. A coating of indium tin oxide (ITO) was sputter deposited onto a first major surface of a glass substrate from an indium/tin cathode using a conventional magnetic sputter vapor deposition (MSVD) device. The ITO coating had a thickness of 300 nm. An external extraction layer was applied by conventional spray pyrolysis onto the second major surface of the glass substrate (opposite the first major surface) using the coating compositions described above. The spray parameters and optical results are shown in Table 6.

TABLE 6

| SAMPLE # | COATING COMPOSITION | SPRAY TIME (min.) | OVEN TEMP ° F. | AIR PRESSURE (psi) | HAZE (Pre-Spray) | TRANSMITTANCE (Pre-Spray) | HAZE (Post-Spray) | TRANSMITTANCE (Post-Spray) |
|---|---|---|---|---|---|---|---|---|
| 5 | 1 | 5 | 450 | 50 | 0.14 | 86.9 | 11.8 | 87.2 |
| 6 | 2 | 10 | 450 | 50 | 0.12 | 87.5 | 19.7 | 87.6 |

Example 3

(A) This Example illustrates a substrate with a silane based external extraction layer. Hi-Gard® HC 1080 coating composition (commercially available from PPG Industries Ohio, Inc.) was spray applied onto a surface of oven heated glass substrates using a conventional spray coating device to form an external extraction layer. The spray parameters and optical measurements are disclosed in Table 7. The coated substrate had haze greater than 50 percent while still maintaining transmittance greater than 87 percent.

TABLE 7

| Sample number | Factors | | | Post Spray | |
|---|---|---|---|---|---|
| | Spray Time (sec.) | Air Pressure (psi) | Oven Temp °F. | Haze | Transmittance |
| 7 | 5 | 40 | 500 | 66 | 92 |
| 8 | 10 | 40 | 500 | 71.2 | 90.1 |
| 9 | 5 | 40 | 500 | 64.9 | 87 |
| 10 | 5 | 40 | 550 | 59.7 | 92.3 |
| 11 | 7 | 40 | 550 | 70.6 | 91.6 |
| 12 | 5 | 40 | 600 | 71.4 | 88.1 |
| 13 | 5 | 75 | 550 | 64 | 92 |
| 14 | 5 | 60 | 550 | 69 | 91.8 |
| 15 | 5 | 75 | 500 | 71.7 | 91.7 |
| 16 | 5 | 75 | 450 | 72.8 | 91.7 |
| 17 | 5 | 60 | 450 | 74.5 | 91.6 |
| 18 | 5 | 40 | 450 | 63.8 | 92.2 |

(B) A Hi-Gard® HC 1080 coating was spray applied to one side of a glass substrate as described above. An indium tin oxide coating of 300 nm was sputter deposited on the opposite side of the substrate using a conventional MSVD coater. The spray deposition parameters and measured optical data are set forth in Table 8. The coated substrate had haze greater than 50 percent while still maintaining transmittance greater than 81 percent.

TABLE 8

| Sample number | Factors | | | Pre-spray Readings | | Post-spray Readings | |
|---|---|---|---|---|---|---|---|
| | Spray Time (sec.) | Air Pressure (psi) | Oven Temp °F. | Haze | Transmittance | Haze | Transmittance |
| 19 | 5 | 40 | 400 | 0.09 | 86.1 | 57.5 | 84.6 |
| 20 | 10 | 40 | 400 | 0.12 | 85.9 | 68.7 | 84.1 |
| 21 | 10 | 40 | 400 | 0.13 | 85.2 | 76.8 | 83.1 |
| 22 | 5 | 40 | 400 | 0.12 | 87.5 | 66.2 | 85.6 |
| 23 | 4 | 40 | 400 | 0.13 | 87.5 | 56.2 | 86.1 |
| 24 | 10 | 50 | 400 | 0.11 | 84.3 | 65.8 | 82.9 |
| 25 | 3 | 40 | 400 | 0.14 | 84.2 | 56 | 82.8 |
| 26 | 5.5 | 75 | 400 | 0.12 | 83.6 | 77.7 | 81.2 |
| 27 | 5.5 | 75 | 400 | 0.11 | 85.7 | 74.5 | 83.4 |

Example 4

This example illustrates a substrate having an internal extraction layer (region). The internal extraction layer was formed using a conventional flame spray device, such as an nHalo flame spray coating device commercially available from Beneq Oy. The coating compositions were selected to form either alumina or titania nanoparticles. Samples 28 to 31 below contain alumina nanoparticles. Samples 32 to 39 contain titania nanoparticles. The nanoparticles were present at a depth in the range of 0 nm to 10 nm from the surface of the glass. As a general rule, as the concentration of nanoparticles increases, the haze increases and the transmittance decreases. Haze and transmittance values were measured on these samples as listed in Table 9.

TABLE 9

| Sample number | Haze | Transmittance |
|---|---|---|
| 28 | 5.22 | 93.0 |
| 29 | 14.9 | 91.7 |
| 30 | 30.2 | 89.5 |
| 31 | 35.8 | 89.9 |
| 32 | 82.7 | 69.4 |
| 33 | 63.3 | 69.9 |
| 34 | 44.0 | 78.0 |
| 35 | 68.6 | 71.0 |
| 36 | 55.5 | 74.6 |
| 37 | 73.6 | 74.1 |
| 38 | 78.0 | 69.5 |
| 39 | 62.9 | 74.1 |

Example 5

This Example relates to a coated substrate having both an internal extraction layer and an external extraction layer. An internal extraction region was formed by softening the first surface by heating and then directing titania nanoparticles at the first surface such that at least a portion of the nanoparticles penetrated below the first surface. This was done using a flame spray device such as described above. The resultant substrate with the internal extraction layer had a haze value (percent) of 55.6 and a transmittance of 74.4 percent. An external extraction layer was formed on the second surface of the substrate by heating the substrate in an oven for eight minutes at 450° F. and then spray applying a Hi-Gard® HC 1080 coating composition (commercially available from PPG Industries Ohio, Inc.) onto the second surface using a conventional spray coating device as described above (40 psi for 10 seconds) to form the external extraction layer on the second surface. The substrate with both the internal extraction layer and the external extraction layer had a haze of 94.4 percent and a transmittance of 74.6 percent.

It will be readily appreciated by one of ordinary skill in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A method for making a light extraction substrate, comprising:
   on a homogeneous glass substrate having a first surface and a second surface, providing:
     a first light extraction region located in the first surface by depositing nanoparticles into the first surface; and
     a second light extraction region on at least a portion of the second surface, the second light extraction region having a surface roughness of at least 10 nm,
   wherein the first light extraction region and the second light extraction region provide haze in the range of 10% to 40%.

2. The method of claim 1, wherein the first light extraction region is formed by:
   heating the first surface to decrease the viscosity of the first surface; and
   directing nanoparticles at the first surface such that the nanoparticles are incorporated into the first surface.

3. The method of claim 1, wherein the nanoparticles are selected from the group consisting of silver oxide, alumina, titania, cerium oxide, zinc oxide, tin oxide, silica, zirconia, and combinations thereof.

4. The method of claim 1, wherein the second light extraction region is formed by applying a coating by sol-gel or spray pyrolysis onto at least a portion of the second surface.

5. The method of claim 1, wherein the second light extraction region is a coating selected from the group consisting of silica, alumina, zinc oxide, titania, zirconia, tin oxide, silicate coatings, and mixtures thereof.

6. The method of claim 1, wherein the second light extraction region is formed by texturing the second surface.

7. The method of claim 1, wherein the second light extraction region has a surface roughness in the range of 50 nm to 500 nm.

8. The method of claim 1, further comprising depositing an underlayer coating stack over the first surface and depositing an anode layer over the underlayer coating stack.

9. A method for making a light extraction substrate, comprising:
providing a homogeneous glass substrate having a first surface and a second surface; and
forming a first light extraction region located in the first surface by:
heating the substrate to a temperature sufficient to soften the first surface;
directing nanoparticles toward the first surface such that the nanoparticles penetrate the first surface and become embedded in the first surface at a depth of 0 to 50 microns; and
forming a second light extraction region over the second surface, wherein the first light extraction region and the second light extraction region provide haze in the range of 10% to 40%.

10. The method of claim 9, wherein the nanoparticles are directed by a carrier gas.

11. The method of claim 9, wherein the second light extraction region is a coating or a textured pattern.

12. The method of claim 9, wherein the second light extraction region has a surface roughness of at least 10 nm.

13. A method for making a light extraction substrate via a float glass process, comprising:
pouring a homogeneous glass melt into a float chamber having a bath of molten metal;
spreading the glass melt across the molten metal to form a glass ribbon having a first surface and a second surface opposite the first surface; and
applying coating materials directly onto the glass ribbon, wherein the coating materials diffuse into or fully penetrate the first surface of the glass ribbon forming a first extraction layer,
wherein the coating materials comprise metal oxide nanoparticles.

14. The method of claim 13, wherein when forming the first extraction layer, the glass ribbon is at a temperature in the range of 400° C. to 1,000° C.

15. The method of claim 13, wherein the molten metal is tin.

16. The method of claim 13, further comprising applying a second extraction layer onto the second surface of the glass ribbon.

17. The method of claim 16, wherein the second extraction layer is formed by applying a coating by sol-gel or spray pyrolysis onto at least a portion of the second surface when the glass ribbon is at a temperature in the range of 50° C. to 600° C.

18. The method of claim 13, further comprising applying a conductive metal oxide layer to the first surface to form an anode.

19. The method of claim 18, further comprising applying an underlayer coating stack under the anode.

20. The method of claim 18, wherein the anode comprises indium tin oxide or aluminum doped zinc oxide.

* * * * *